(12) United States Patent
Voldman et al.

(10) Patent No.: US 7,041,581 B2
(45) Date of Patent: May 9, 2006

(54) METHOD AND STRUCTURE FOR IMPROVING LATCH-UP IMMUNITY USING NON-DOPANT IMPLANTS

(75) Inventors: Steven H. Voldman, South Burlington, VT (US); Louis D. Lanzerotu, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 766 days.

(21) Appl. No.: 09/991,771

(22) Filed: Nov. 16, 2001

(65) Prior Publication Data

US 2004/0219769 A1    Nov. 4, 2004

(51) Int. Cl.
*H01L 21/425* (2006.01)
(52) U.S. Cl. .................. 438/527; 438/528; 438/514
(58) Field of Classification Search ............. 438/291, 438/525, 290, 514, 528, 203, 197, 527, 289, 438/459, 407
See application file for complete search history.

(56) References Cited

U.S. PATENT DOCUMENTS

| | | | |
|---|---|---|---|
| 4,728,619 A | 3/1988 | Pfiester et al. ............ 437/34 |
| 5,212,101 A | 5/1993 | Canham et al. ............ 437/24 |
| 5,296,387 A * | 3/1994 | Aronowitz et al. ......... 438/528 |
| 5,654,210 A | 8/1997 | Aronowitz et al. ......... 438/526 |
| 5,770,504 A | 6/1998 | Brown et al. .............. 438/296 |
| 5,861,330 A * | 1/1999 | Baker et al. ............... 438/529 |
| 6,013,546 A | 1/2000 | Gardner et al. ............ 438/231 |
| 6,054,344 A | 4/2000 | Liang et al. .............. 438/223 |
| 6,110,800 A | 8/2000 | Chou ....................... 438/431 |
| 6,232,639 B1 * | 5/2001 | Baker et al. ............... 257/372 |
| 6,486,510 B1 * | 11/2002 | Brown et al. .............. 257/327 |
| 6,797,576 B1 * | 9/2004 | Teng et al. ................ 438/525 |
| 2004/0219769 A1 * | 11/2004 | Voldman et al. ........... 438/528 |

* cited by examiner

*Primary Examiner*—Walter L. Lindsay, Jr.
(74) *Attorney, Agent, or Firm*—William D. Sabo

(57) ABSTRACT

The preferred embodiment of the present invention overcomes the limitations of the prior art and provides a device and method to increase the latch-up immunity of CMOS devices by forming a non-dopant region near the edge of a dopant region. The preferred embodiment method to increase the latch-up immunity of CMOS devices uses hybrid photoresist to selectively form non-dopant implants near the edges of the N-well and/or P-well. The non-dopant implants suppress diffusion of dopant in the wells resulting in greater control of well spacing, and hence reducing the gain of the parasitic transistor. This reduces the propensity of the CMOS device to latch-up. The preferred embodiment method allows the non-dopant implants to be formed without requiring additional masking steps over the prior art methods.

20 Claims, 7 Drawing Sheets

METHOD AND STRUCTURE FOR IMPROVING LATCH-UP IMMUNITY USING NON-DOPANT IMPLANTS

FIELD OF THE INVENTION

The present invention generally relates to semiconductor devices, and more specifically relates to methods and structures for improving latch-up immunity.

BACKGROUND OF THE INVENTION

As integrated semiconductor devices continue to grow in complexity, there is a constant need to increase the density of the semiconductor devices. This increase in density creates several problems that can cause device failures if not addressed. Once such problem is the propensity for semiconductor devices, particularly CMOS devices, to "latch-up". Latch-up is a well known problem caused by unwanted transistor action between elements of the integrated circuit. This unwanted transistor action can be triggered by a wide variety of events, and can cause the semiconductor device to fail.

Latch-up is generally caused by the close proximity of n-channel and p-channel devices in modern CMOS devices. For example, a typical CMOS device fabricated on a p-type substrate would contain a p-channel device fabricated in an n-well and an n-channel device fabricated in a p-well, with only a short distance between the wells. The short distance between the wells is referred to as the junction. A junction is formed when the dopant concentration in the substrate changes from an acceptor concentration (i.e. p-well) to a donor concentration (i.e. n-well). This structure inherently forms a parasitic bipolar NPN structure and parasitic PNP bipolar structure. Under certain biasing conditions the PNP structure can supply base current to the NPN structure (or vice versa), causing a large current to flow from the PNPN anode to cathode. When a PNPN device triggers, the PNPN undergoes a transition from a low current/high voltage state to a low voltage/high current state. In some cases, the low voltage/high current state can lead to thermal runaway and destruction of the elements involved in the formation of the PNPN parasitic device.

Thus, there is a need for improved methods for increasing the latch-up immunity of CMOS devices that will allow for further device scaling and increased device density.

SUMMARY OF THE INVENTION

The present invention overcomes the limitations of the prior art and provides a device and method to increase the latch-up immunity of CMOS devices by forming a non-dopant region near the edge of a dopant region. The preferred embodiment method to increase the latch-up immunity of CMOS devices uses hybrid photoresist to selectively form non-dopant implants near the edges of the N-well and/or P-well. The non-dopant implants suppress diffusion of dopant in the wells resulting in greater control of well spacing, and hence reducing the gain of the parasitic transistor. This reduces the propensity of the CMOS device to latch-up. The preferred embodiment method allows the non-dopant implants to be formed without requiring additional masking steps over the prior art methods.

The advantages of this invention will become apparent from the following detailed description of the presently preferred embodiment of the invention, taken in conjunction with the accompanying drawings.

BRIEF DESCRIPTION OF THE DRAWINGS

The preferred exemplary embodiment of the present invention will hereinafter be described in conjunction with the appended drawings, where like designations denote like elements.

Figure 1:
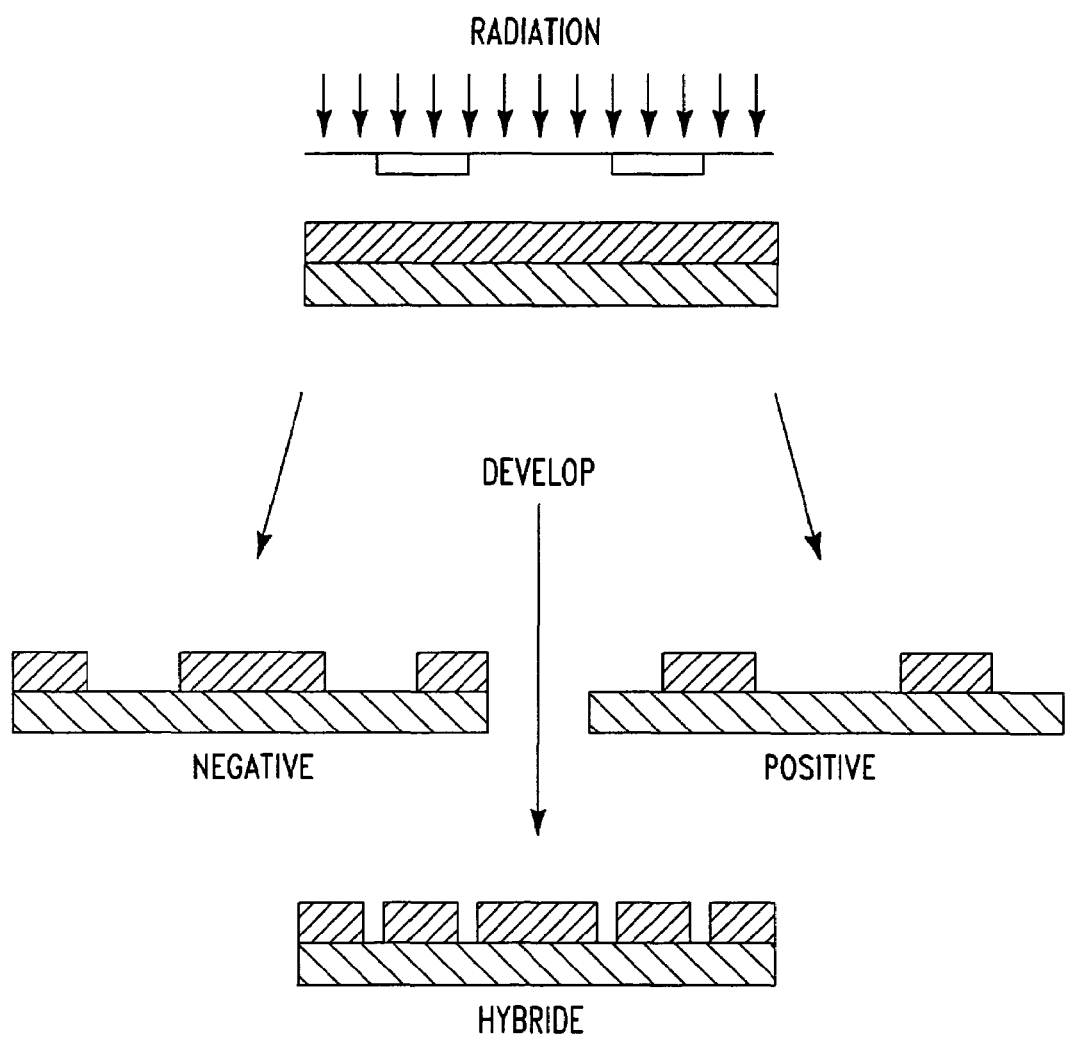
FIG. 1 is a schematic diagram showing the use of hybrid photoresist according to the prior art.

In the drawings, the relative dimensions of the various layers and structures illustrated are not necessarily to scale.

DETAILED DESCRIPTION OF THE INVENTION

The preferred embodiment of the present invention overcomes the limitations of the prior art and provides a device and method to increase the latch-up immunity of CMOS devices by selectively forming a non-dopant region near the edges of the N-well and/or P-well. The non-dopant region suppresses diffusion of dopant in the well resulting in greater control of well spacing.

The gain of a parasitic transistor in a CMOS device is a function of many parameters including well spacing. In particular, the dopant profile can influence the parasitic bipolar gain of the parasitic transistor. Thus, the placement and control of the well-profile edge can strongly influence the latch-up characteristics of an advanced CMOS process. Today, the P-well-to-N-well spacing control is determined in part by overlay variations and transient enhanced diffusion (TED) of dopant. For a CMOS device formed in a silicon substrate, during subsequent hot processing steps, TED can lead to further movement of the well-profile edge due to silicon interstitials interacting with the well dopant (i.e. boron, phosphorous) causing enhancement of the dopant diffusion coefficients (Poate et al., IEDM Technical Digest, p. 77, 1995; and D. J. Eaglesham et al., Applied Physics Letters, Vol. 65, p. 2305, 1994). As the devices are scaled and the well spacing decreases, the ability to limit the parasitic gain by controlling the well profile using prior art fabrication technologies will be increasingly problematic.

Shallow trench isolation (STI) has been used between the n-channel and p-channel devices to minimize the likelihood of latch-up. However, when CMOS technologies are scaled to smaller dimensions, all geometric parameters including the P-well-to-N-well spacing and STI dimensions are reduced. As the P-well-to-N-well spacing and the STI depth and/or width are reduced, latch-up immunity is decreased as a result of the P-well profile edge and the N-well profile edge under the STI being formed closer to each other. TED of well dopants further reduces the P-well-to-N-well spacing under the STI resulting in a further decrease in latch-up immunity.

Suppressing TED of the well dopants has become an important factor in controlling the P-well-to-N-well spacing under the STI. One method for suppressing TED of well dopants such as boron or phosphorous, includes forming a carbon population under the STI extending from the P-well to the N-well through the junction. Carbon is known to suppress TED of boron as shown by Stolk (Stolk, Applied Physics Letters, Vol. 66, p. 1370, 1995) while similar effects of carbon on phosphorous have been observed by the present inventors. However, the levels of carbon required to adequately suppress TED of boron or phosphorous also induces high leakage current in the junction. Thus, the prior art does not provide for a sufficient level of carbon to be present in the P-well or N-well to suppress TED without adversely affecting leakage current in the junction.

Commonly assigned U.S. Pat. No. 6,033,949 to Baker et al., herein incorporated by reference, discloses a hybrid photoresist used in semiconductor processing. Referring to FIG. 1, hybrid photoresist has the properties that when exposed to actinic radiation through a photolithographic mask, portions of the hybrid photoresist which are blocked by mask shapes (i.e. chrome mask shapes) are unexposed and remain insoluble in the developer forming positive tone line patterns. Portions of the hybrid photoresist which are exposed with high intensity radiation (i.e. clear portions of the photolithographic mask) remain insoluble in the developer and form a negative tone line image. Portions of the hybrid photoresist which are exposed with intermediate amounts of intensity (i.e. the edges of the chrome/clear portions of the photolithographic mask) are dissolved during the development step to form an opening.

A preferred method for selectively forming a non-dopant region within a dopant region (i.e. N-well or P-well) without requiring additional masking steps will be described with reference to a first embodiment shown in FIGS. 2–6. The preferred method begins with a semiconductor substrate as is commonly used in CMOS devices. An example of such a substrate is a wafer portion with a P+ substrate and a P-epitaxial layer at the top portion. Of course other suitable substrate materials can be used.

The first step is to form isolation regions between devices. These isolation regions, preferably shallow trench isolation (STI), are used to separate n-channel from p-channel devices. The STI can be formed with any suitable processing method. One such method uses reactive ion etching (RIE) to form the STI trench in the substrate. An oxide liner is then suitably grown on the walls and bottom of the STI trench. The STI trench is then filled, suitably with oxide, and the substrate is planarized using chemical mechanical polish (CMP).

Figure 2:
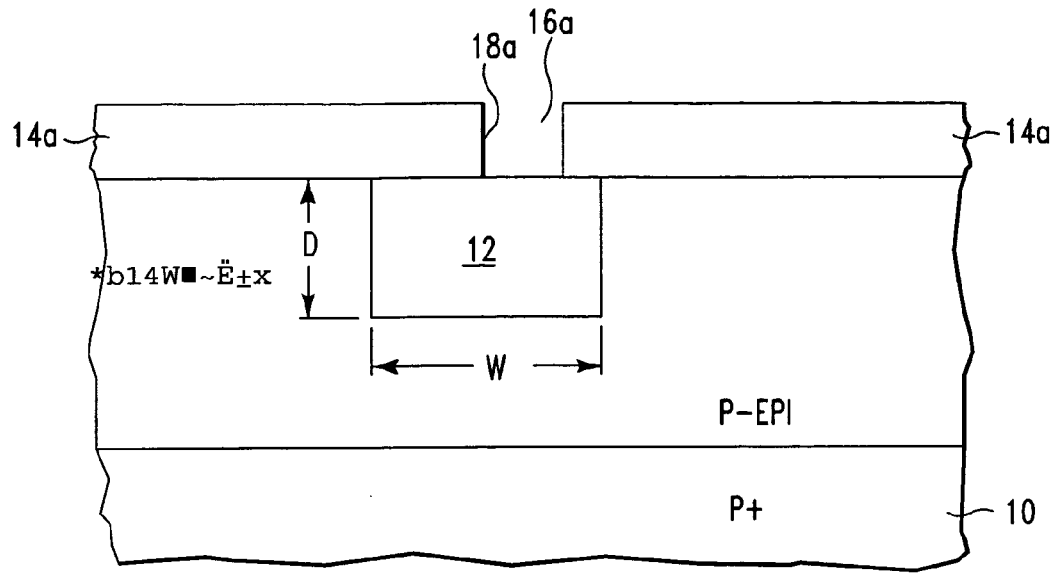
FIG. 2 is a cross-sectional side view of a portion of a substrate with a shallow trench isolation formed within and with hybrid photoresist patterned for non-dopant region formation.

A portion of substrate 10 consisting of P+substrate and P-epitaxial layer at the top portion is shown in FIG. 2. STI 12 having a depth D and width W is formed in substrate 10 by methods known in the art as described previously. Hybrid photoresist layer 14a is deposited across the surface of substrate 10. Hybrid photoresist layer 14a is then exposed to actinic radiation with the areas which are to be dopant regions blocked with suitable mask shapes (i.e. chrome mask shapes) and developed. Portions of hybrid photoresist layer 14a which are unexposed (i.e. dopant regions) remain insoluble in the developer and form positive tone line patterns. Portions of hybrid photoresist layer 14a which are exposed with high intensity radiation (i.e. portions other than the dopant regions) remain insoluble in the developer and form a negative tone line image. Portions of hybrid photoresist layer 14a which are exposed with intermediate amounts of intensity (i.e. the edges of the dopant regions) are dissolved during the development step to form opening 16a having resist edge 18a.

Figure 3:
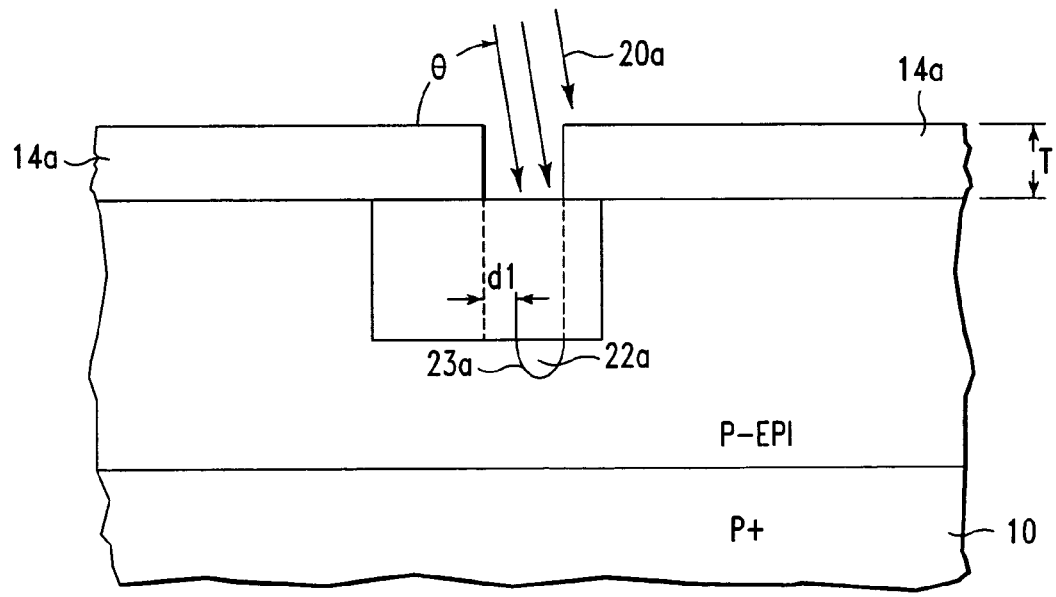
FIG. 3 is a cross-sectional side view of a portion of a substrate showing non-dopant region formation.

Ion implant 20a through opening 16a is performed to form non-dopant region 22a under STI 12 as shown in FIG. 3. Ion implant 20a is performed at an angle theta relative to the surface of substrate 10 using resist edge 18a as a shadow resulting in non-dopant region 22a having non-dopant edge 23a aligned distance d1 away from resist edge 18a.

Figure 4:
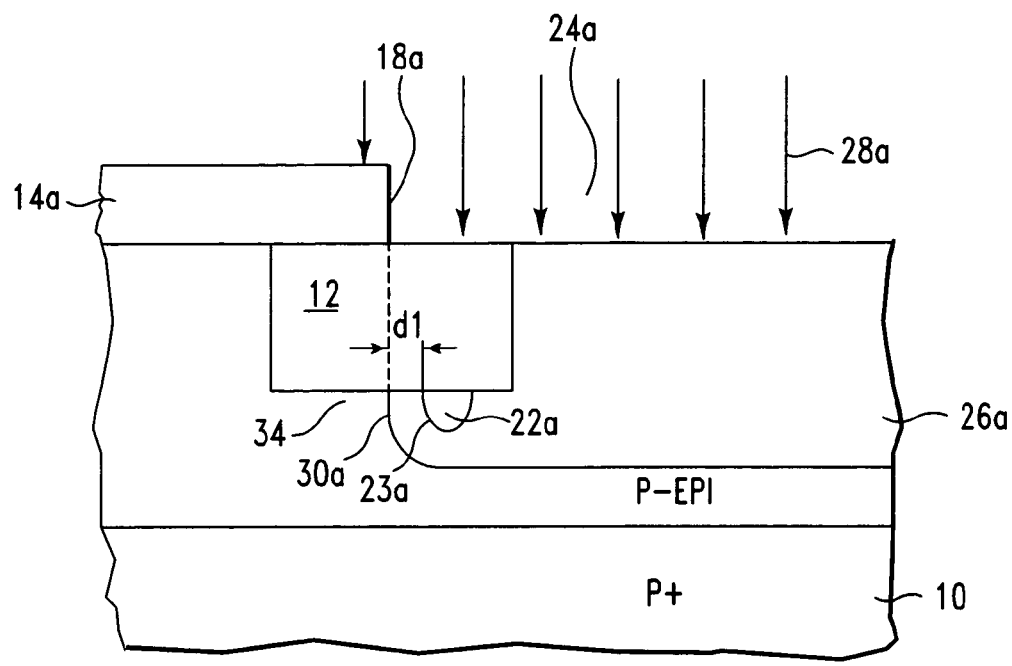
FIG. 4 is a cross-sectional side view of a portion of a substrate showing dopant region formation.

FIG. 4 shows substrate 10 with non-dopant region 22a formed. Because the portion of hybrid photoresist layer 14a above the dopant region was unexposed during actinic radiation exposure, this portion consists of positive tone patterns. Thus, the portion of hybrid photoresist above the dopant region can be removed by blanket exposing substrate 10 and developing away the positive tone pattern to form opening 24a. Thus, this removal can be done without requiring additional masking layers or masking steps.

Dopant region 26a is formed using ion implant 28a through opening 24a. In a preferred embodiment, dopant region 26a is an N-well consisting of phosphorous or a P-well consisting of boron. Ion implant 28a is preferably a vertical implant, that is, the ion implant is directed at an angle substantially normal to the surface of substrate 10. The remaining negative tone portion of hybrid photoresist mask 14a serves to block off the non-well regions from receiving ion implant 28a. Resist edge 18a also remains in place with the remaining negative tone portion of hybrid photoresist mask 14a. Because a vertical ion implant 28a is performed to form dopant region 26a, dopant edge 30a is formed self-aligned to resist edge 18a. Since an angle ion implant 20a was used to form non-dopant region 22a, non-dopant edge 23a is aligned distance d1 away from resist edge 18a resulting in non-dopant edge 23a spaced distance d1 away from dopant edge 30a. Thus, resist edge 18a and dopant edge 30a are self-aligned, while non-dopant edge 23a is aligned in a spaced relation away from resist edge 18a and dopant edge 30a by distance d1. By using resist edge 18a as a common reference point, non-dopant region 22a can be reliably formed within dopant region 26a and away from junction 34.

As an example, a preferred non-dopant used to form non-dopant region 22a is carbon. The dose for ion implant 20a is chosen to provide a carbon concentration in non-dopant region 22a that is effective in suppressing TED, preferably about 1E19/cm3 to about 2E22/cm3, more preferably a carbon concentration of 2E20/cm3. Further, for a hybrid photoresist layer thickness T of about 2 um, STI depth D of about 0.25 um and width W of about 1 um, ion implant 20a is performed at an angle theta from about 86 degrees to about 89 degrees relative to the surface of substrate 10 using resist edge 18a as a shadow resulting in carbon edge 23a aligned about 500 Angstroms to about 1500 Angstroms away from resist edge 18a. Having non-dopant edge 23a spaced away from dopant edge 30a ensures that a carbon concentration of less than about 1E17/cm3 is present injunction 34, thus avoiding high leakage currents in the junction.

Figure 5:
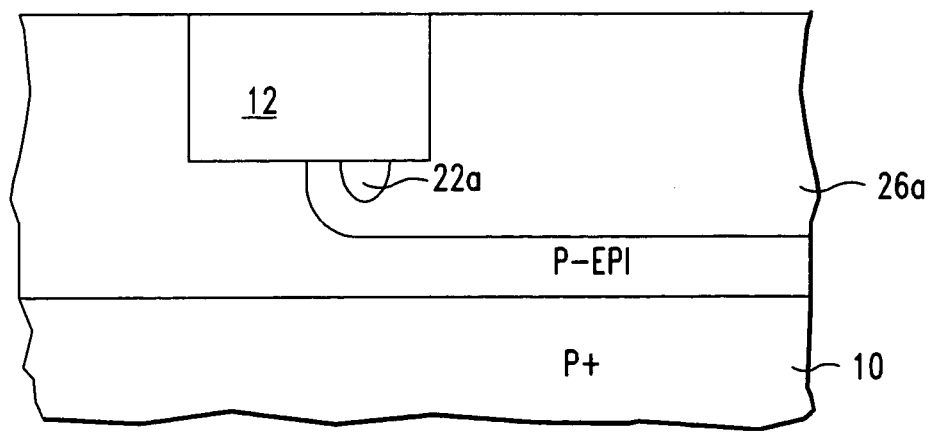
FIG. 5 is a cross-sectional side view of a portion of a substrate with a non-dopant region formed within a dopant region according to the present invention.

With dopant region 26a formed, the remaining negative tone portion of hybrid photoresist mask 14a is removed by methods known in the art such as an oxygen ash to form the resulting single well structure shown in FIG. 5. Non-dopant region 22a suppresses diffusion of dopant in dopant region 26a so that movement of dopant edge 30a under STI 12 is reduced.

As will be apparent to those skilled in the art, other methods can be used to form non-dopant region 22a within dopant region 26a such as using conventional photoresist and two masking levels. For example, a first photoresist layer can be patterned by a first mask to define dopant region 26a. After forming dopant region 26a, the first photoresist layer is removed and a second photoresist layer is patterned by a second mask to define non-dopant region 22a. To ensure that non-dopant edge 23a is spaced away from dopant edge 30a, the use of conventional photoresist requires very good alignment of the first and second masks. Hybrid photoresist eliminates any mask alignment tolerances since resist edge 18a remains on substrate 10 for both non-dopant region 22a and dopant region 26a formation.

Figure 6A:
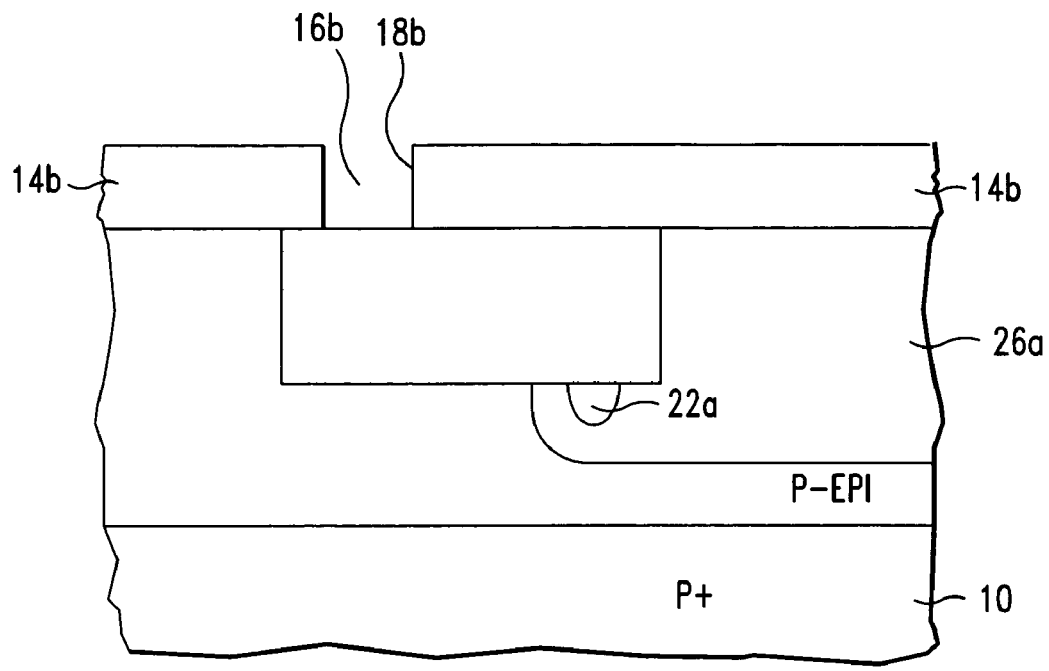
FIGS. 6A–D are cross-sectional side views of a substrate showing the formation of a double well structure with non-dopant regions.

The method as described in FIGS. 2–4 can also be applied to form a second non-dopant region within a second dopant region under STI 12. Beginning with the structure shown in FIG. 5, hybrid photoresist layer 14b is deposited across the surface of substrate 10 as shown in FIG. 6A. Hybrid photoresist layer 14b is then exposed to actinic radiation with the areas which are to be second dopant regions blocked with suitable mask shapes (i.e. chrome mask shapes) and developed. Portions of hybrid photoresist layer 14b which are unexposed (i.e. second dopant regions) remain insoluble in the developer and form positive tone line patterns. Portions of hybrid photoresist layer 14b which are exposed with high intensity radiation (i.e. portions other than second dopant regions) remain insoluble in the developer and form a negative tone line image. Portions of hybrid photoresist layer 14b which are exposed with intermediate amounts of intensity (i.e. the edges of second dopant regions) are dissolved during the development step to form opening 16b having resist edge 18b.

Figure 6B:
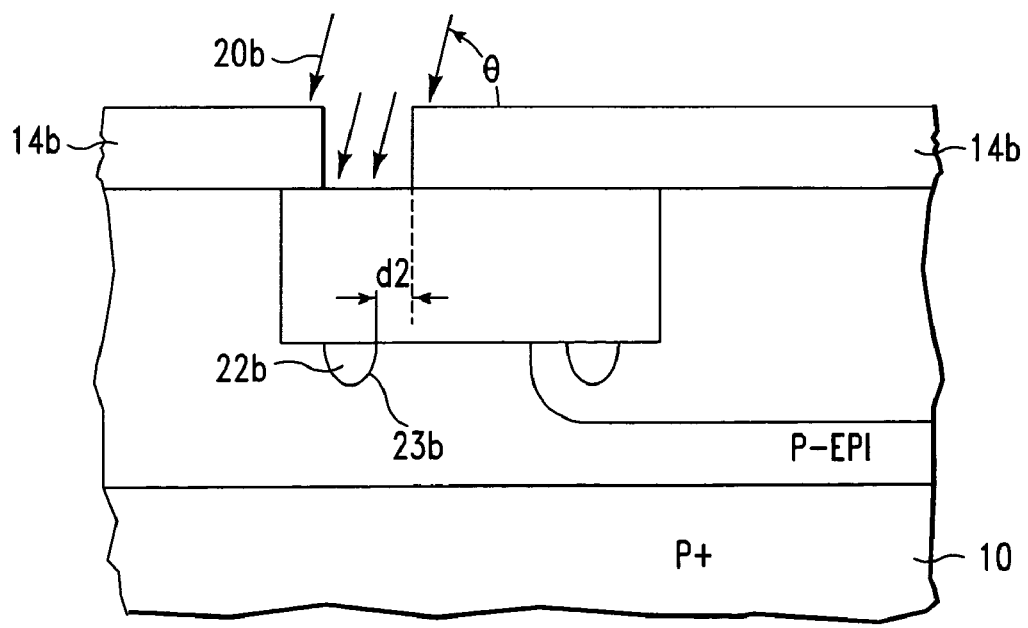

As with ion implant 20a, ion implant 20b through opening 16b is performed to form non-dopant region 22b under STI 12 as shown in FIG. 6B. Ion implant 20b is performed at an angle theta relative to the surface of substrate 10 using resist edge 18b as a shadow resulting in non-dopant region 22b having non-dopant edge 23b aligned distance d2 away from resist edge 18b.

Non-dopant region 22b is typically formed of the same element that is used to form non-dopant region 22a, however non-dopant regions 22a and 22b can be formed from different elements as long as the elements can suppress TED of dopant atoms. As with non-dopant region 22a, a preferred non-dopant used to form non-dopant region 22b is carbon.

Figure 6C:
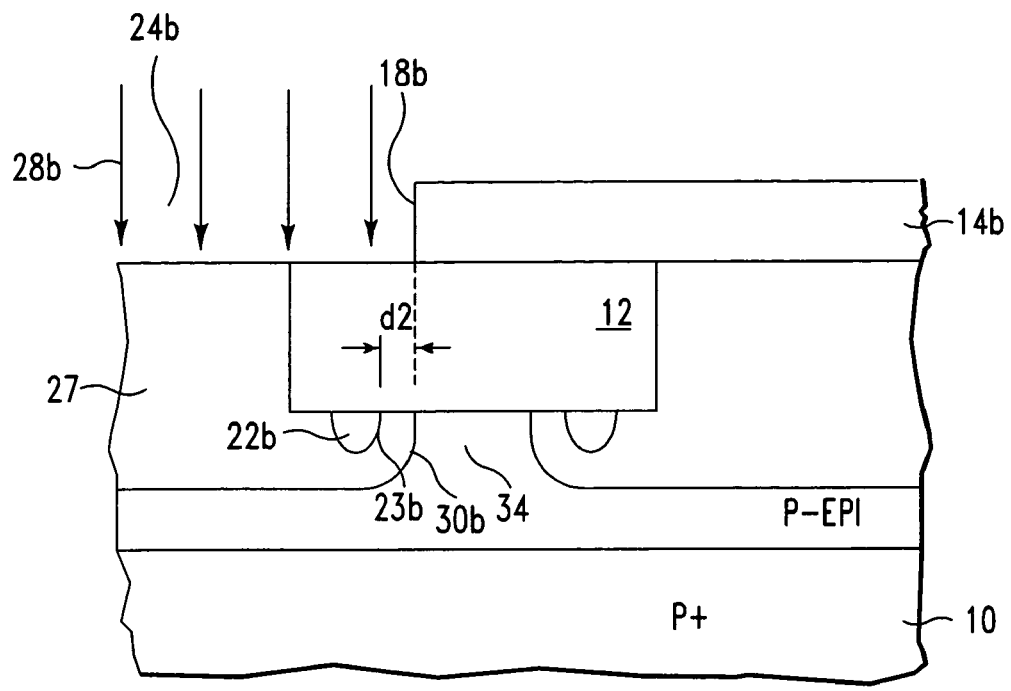

Referring to FIG. 6C, the portion of hybrid photoresist above the dopant region can be removed by blanket exposing substrate 10 and developing away the positive tone pattern to form opening 24b. Thus, this removal can be done without requiring additional masking layers or masking steps.

Dopant region 27 is formed using ion implant 28b through opening 24b. In a preferred embodiment, when dopant region 26a is an N-well consisting of phosphorous, dopant region 27 is formed to be a P-well consisting of boron. Ion implant 28b is preferably a vertical implant, that is, the ion implant is directed at an angle substantially normal to the surface of substrate 10. The remaining negative tone portion of hybrid photoresist mask 14b serves to block off the non-well regions from receiving ion implant 28b. Resist edge 18b also remains in place with the remaining negative tone portion of hybrid photoresist mask 14b. Because a vertical ion implant 28b is performed to form dopant region 27, dopant edge 30b is formed self-aligned to resist edge 18b. Since an angle ion implant 20b was used to form non-dopant region 22b, non-dopant edge 23b is aligned distance d2 away from resist edge 18b resulting in non-dopant edge 23b spaced distance d2 away from dopant edge 30b. Thus, resist edge 18b and dopant edge 30b are self-aligned to each other, while non-dopant edge 23b is aligned in a spaced relation away from resist edge 18b by a distance d2. By using resist edge 18b as a common reference point, non-dopant region 22b can be reliably formed within dopant region 27 and away from junction 34. For the case of non-dopant region 22b of carbon, having non-dopant edge 23b spaced away from dopant edge 30b ensures that a carbon concentration of less than about 1E17/cm3 is present in junction 34, thus avoiding high leakage currents in the junction.

Figure 6D:
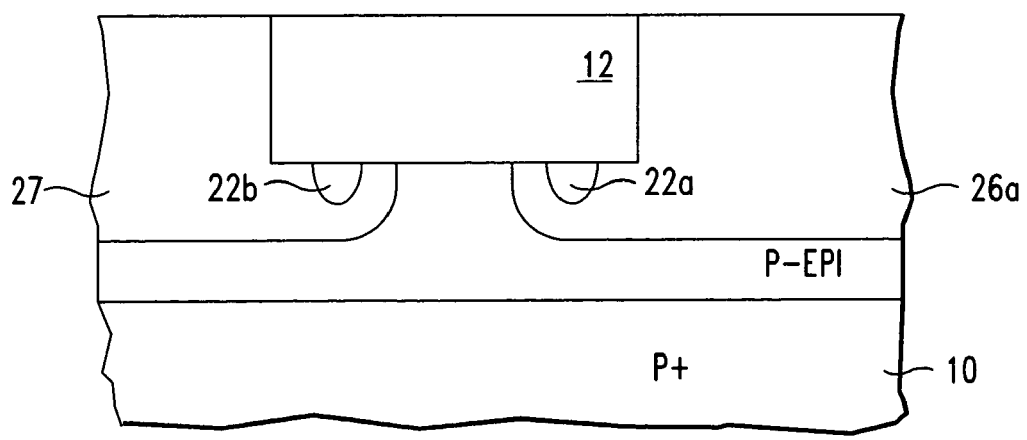

With dopant region 27 formed, the remaining negative tone portion of hybrid photoresist mask 14b is removed by methods known in the art such as an oxygen ash to form the resulting double well structure shown in FIG. 6D. Non-dopant region 22b suppresses lateral diffusion of dopant in dopant region 27 so that movement of dopant edge 30b under STI 12 is reduced. Further, for the case when dopant region 26a is an N-well, dopant region 27 is a P-well, and non-dopant regions 22a, 22b are of carbon, carbon regions 22a, 22b suppress the diffusion of dopants from both the N and P-wells so that CMOS device scalability is improved since the amount of movement of dopant edges 30a, 30b towards each other is reduced so that greater control of the P-well-to-N-well spacing is realized resulting in an increase in latch-up immunity.

Second Embodiment

A second embodiment of the present invention will now be described with reference to commonly assigned U.S. Pat. No. 6,033,949 to Baker et al. Baker et al. teaches forming a well edge implant consisting of a heavy dose of boron or phosphorous located under the STI at the edge of a corresponding P or N-well for increasing latch-up immunity for CMOS devices. As discussed in the first embodiment, dopants such as boron or phosphorous can diffuse due to TED. By forming a non-dopant region such as carbon within the well edge implant, diffusion of dopant under the STI can be suppressed resulting in a further improvement in latch-up immunity. A method according to the present invention for forming a non-dopant region within a well edge implant will be described with reference to FIGS. 7–10.

Figure 7A:
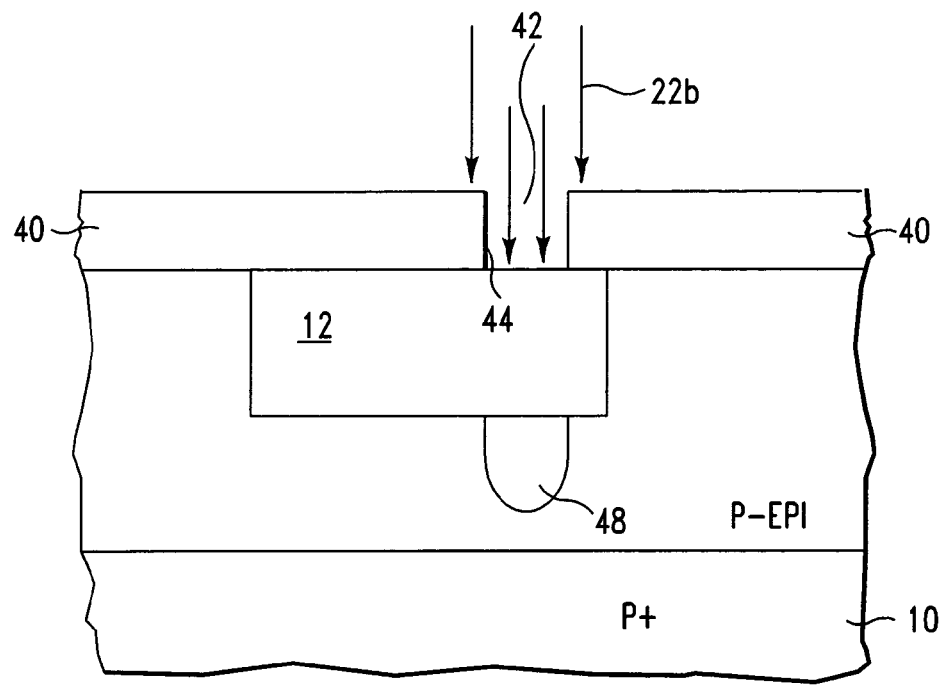
FIGS. 7–10 illustrate the formation of non-dopant regions within a well edge implant according to a second embodiment of the present invention.
Figure 7B:
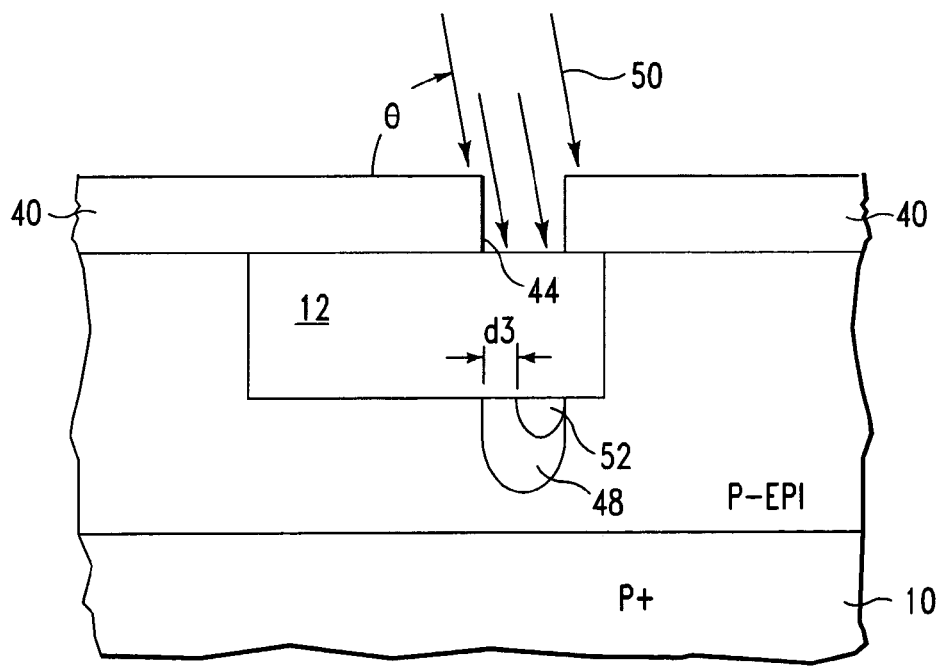

FIG. 7A shows hybrid photoresist layer 40 having opening 42 and resist edge 44 formed on substrate 10. Opening 42 is formed using a hybrid photoresist layer as was described in the first embodiment of the present invention. Vertical ion implant 46 through opening 42 is performed to form well edge implant 48 self-aligned to resist edge 44. Well edge implant 48 is preferably a dopant such as boron or phosphorous. Using the same hybrid photoresist layer 40, FIG. 7B shows angle ion implant 50 at an angle theta through opening 42 is performed to form non-dopant region 52 within well edge implant 48 and aligned in a spaced relation away from resist edge 44 by a distance d3. The order of forming well edge implant 48 and non-dopant region 52 is not critical since the same opening 42 is used to form both structures. Thus, non-dopant region 52 can be formed first, followed by well edge implant 48.

Figure 8:
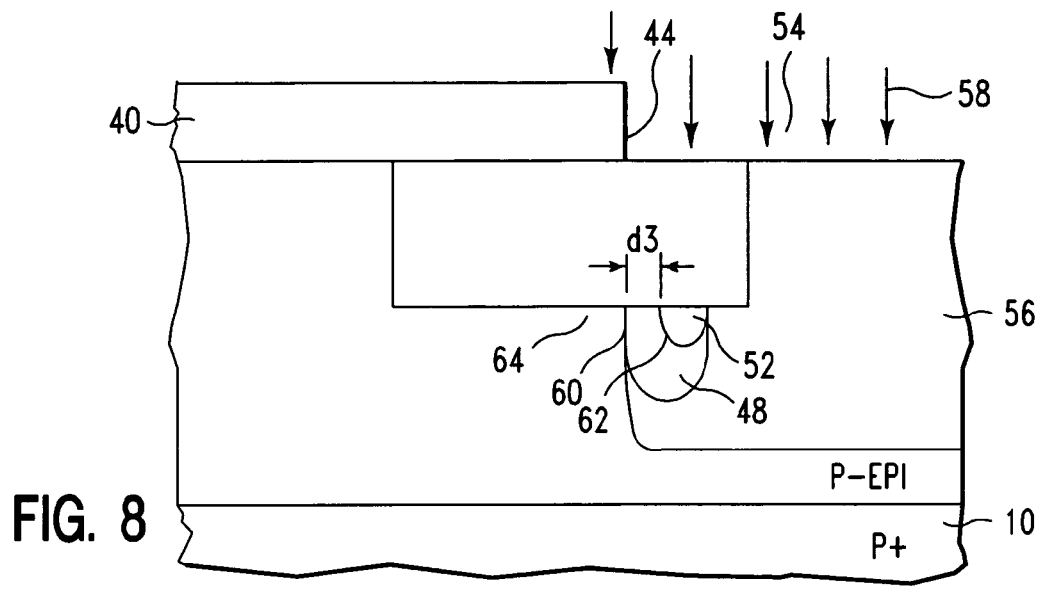

Well implant 56 is formed by removing a portion of hybrid photoresist layer 40 to form opening 54 and performing vertical ion implant 58 as shown in FIG. 8. Well implant 56 is formed self-aligned to resist edge 44. Dopant edge 60 is a common edge for both well edge implant 48 and well implant 56 since both are self-aligned to resist edge 44. Since an angle ion implant 50 is used to form non-dopant region 52, non-dopant edge 62 is aligned distance d3 away from resist edge 44 resulting in non-dopant edge 62 spaced distance d3 away from dopant edge 60. By using resist edge 44 as a common reference point, non-dopant region 52 can be reliably formed within both well edge implant 48 and well implant 56. Consequently, non-dopant edge 62 is formed distance d3 away from dopant edge 60 and junction 64.

Figure 9:
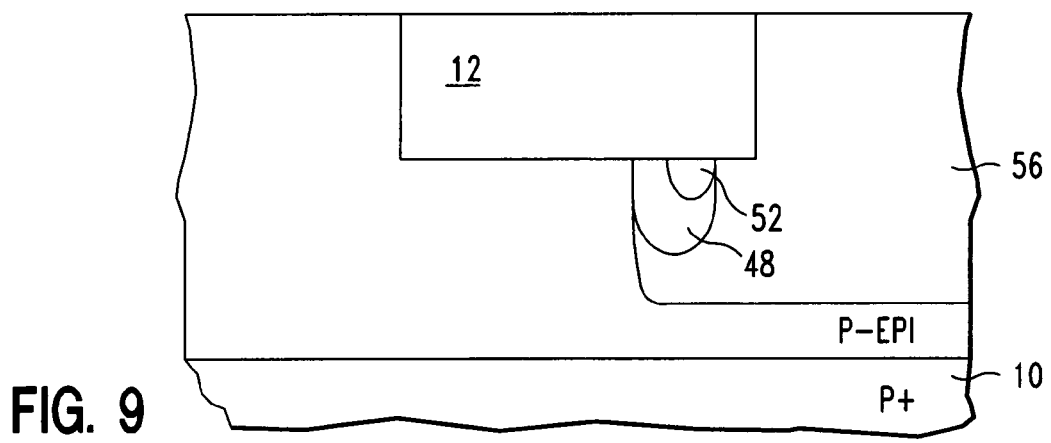
Figure 10:
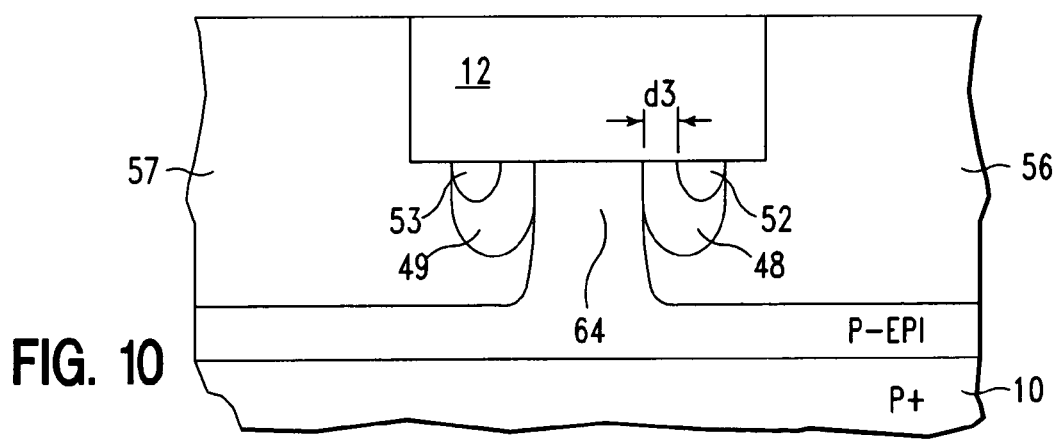

With dopant region 56 formed, the remaining negative tone portion of hybrid photoresist mask 40 is removed by methods known in the art such as an oxygen ash to form the resulting single well structure shown in FIG. 9. As with the first embodiment, a double well structure can also be formed by the second embodiment of the present invention by repeating the method described with reference to FIGS. 7–9 applied to the opposite corner of the STI. FIG. 10 illustrates a second non-dopant region 53, a second well edge implant 49, and a second dopant region 57.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described herein above are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method for forming a semiconductor device with increased latch-up immunity, the method comprising the steps of:
   providing a semiconductor substrate;
   forming a non-dopant region having a non-dopant edge in the semiconductor substrate; and
   forming a dopant region having a dopant edge in the semiconductor substrate, wherein said non-dopant region is within the dopant region and said non-dopant edge is aligned in spaced relation away from the donant edge; and
   wherein the step of forming a non-dopant region comprises the steps of:
   forming a hybrid photoresist layer on the semiconductor substrate;
   patterning the hybrid photoresist layer to form a first opening having a first edge; and
   forming said non-dopant region in the semiconductor substrate through the first opening, said non-dopant edge aligned in spaced relation away from the first edge.

2. The method of claim 1, wherein the step of forming a dopant region comprises the steps of:
   removing a first portion of the hybrid photoresist layer to form a second opening in the hybrid photoresist layer, wherein a second portion of the hybrid photoresist layer including the first edge remains on the semiconductor substrate; and
   forming the dopant region through the second opening, the dopant edge aligned with the first edge.

3. The method of claim 1, wherein the step of patterning the hybrid photoresist layer to form the first opening comprises exposing the hybrid photoresist through a mask containing a plurality of shapes and developing the hybrid photoresist such that portions of the hybrid photoresist which were exposed to intermediate amounts of exposure are removed.

4. The method of claim 2, wherein the step of removing a first portion of the hybrid photoresist layer to form a second opening in the hybrid photoresist layer comprises blanket exposing and developing the hybrid photoresist.

5. The method of claim 1, wherein the step of forming a non-dopant region comprises angle ion implanting using the first edge as a shadow to form said non-dopant edge in spaced relation away from the first edge.

6. The method of claim 5, wherein the angle ion implanting occurs at an angle from about 86 degrees to about 89 degrees from the semiconductor substrate.

7. The method of claim 1, wherein after the step of patterning the hybrid photoresist layer to form a first opening, forming a second dopant region in the semiconductor substrate through the first opening, the second dopant region having a second dopant edge aligned with the first edge.

8. The method of claim 7, wherein said non-dopant region is within the second dopant region.

9. The method of claim 7, Wherein said non-dopant edge is aligned in spaced relation away from the second dopant edge.

10. A method for forming a semiconductor device with increased latch-up immunity, the method comprising the steps of:
    providing a semiconductor substrate;
    forming a non-dopant region having a non-dopant edge in the semiconductor substrate; and
    forming a dopant region having a dopant edge in the semiconductor substrate, wherein said non-dopant region is within the dopant region and said non-dopant edge is aligned in spaced relation away from the dopant edge; and
    wherein said non-dopant region is formed under a shallow trench isolation.

11. A method for forming a semiconductor device with increased latch-up immunity, the method comprising the steps of:
    providing a semiconductor substrate;
    forming a non-dopant region having a non-dopant edge in the semiconductor substrate; and
    forming a dopant region having a dopant edge in the semiconductor substrate, wherein said non-dopant region is within the dopant region and said non-dopant edge is aligned in spaced relation away from the dopant edge; and
    wherein said non-dopant region suppresses diffusion of dopant near the dopant edge.

12. A method for forming a semiconductor device with increased latch-up immunity, the method comprising the steps of:
    providing a semiconductor substrate;
    forming a non-dopant region having a non-dopant edge in the semiconductor substrate; and
    forming a dopant region having a dopant edge in the semiconductor substrate, wherein said non-dopant region is within the dopant region and said non-dopant edge is aligned in spaced relation away from the dopant edge; and
    wherein said non-dopant region comprises a Group IV element.

13. The method of claim 12, wherein said Group IV element comprises carbon.

14. The method of claim 13, wherein said carbon has a concentration of about 2E20/cm3.

15. A method for forming a semiconductor device with increased latch-up immunity, the method comprising the steps of:
   providing a semiconductor substrate;
   forming a non-dopant region having a non-dopant edge in the semiconductor substrate; and
   forming a dopant region having a dopant edge in the semiconductor substrate, wherein said non-dopant region is within the dopant region and said non-dopant edge is aligned in spaced relation away from the dopant edge; and
   wherein the dopant region comprises an N type well.

16. The method of claim 15, wherein the N type well comprises phosphorous.

17. A method for forming a semiconductor device with increased latch-up immunity, the method comprising the steps of:
   providing a semiconductor substrate;
   forming a non-dopant region having a non-dopant edge in the semiconductor substrate; and
   forming a dopant region having a dopant edge in the semiconductor substrate, wherein said non-dopant region is within the dopant region and said non-dopant edge is aligned in spaced relation away from the dopant edge; and
   wherein the dopant region comprises a P type well.

18. The method of claim 17, wherein the P type well comprises boron.

19. A method for forming a semiconductor device with increased latch-up immunity, the method comprising the steps of:
   providing a semiconductor substrate;
   forming a non-dopant region having a non-dopant edge in the semiconductor substrate; and
   forming a dopant region having a dopant edge in the semiconductor substrate, wherein said non-dopant region within the dopant region and said non-dopant edge is aligned in spaced relation away from the dopant edge; and
   wherein said non-dopant edge is from about 500 Angstroms to about 1500 Angstroms away from the dopant edge.

20. A method for forming a semiconductor device with increased latch-up immunity, the method comprising the steps of:
   providing a semiconductor substrate;
   forming a non-dopant region having a non-dopant edge in the semiconductor substrate; and
   forming a dopant region having a dopant edge in the semiconductor substrate, wherein said non-dopant region is within the dopant region and said non-dopant edge is aligned in spaced relation away from the dopant edge; and
   wherein the step of forming a dopant region comprises ion implanting at an angle substantially normal to the semiconductor substrate.

* * * * *